United States Patent
Prasad et al.

(10) Patent No.: US 7,088,147 B2
(45) Date of Patent: Aug. 8, 2006

(54) SAMPLE AND HOLD CIRCUITS AND METHODS WITH OFFSET ERROR CORRECTION AND SYSTEMS USING THE SAME

(75) Inventors: Ammisetti V. Prasad, Austin, TX (US); Karl Thompson, Converse, TX (US); John Laurence Melanson, Austin, TX (US); Shyam Somayajula, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 417 days.

(21) Appl. No.: 10/417,443

(22) Filed: Apr. 16, 2003

(65) Prior Publication Data

US 2004/0210801 A1  Oct. 21, 2004

(51) Int. Cl.
*G11C 27/02* (2006.01)

(52) U.S. Cl. .......................................... 327/91; 327/96
(58) Field of Classification Search .................. 327/91, 327/93–96, 337, 554
See application file for complete search history.

(56) References Cited

U.S. PATENT DOCUMENTS

| | | | |
|---|---|---|---|
| 4,543,534 A | 9/1985 | Temes et al. | |
| 5,376,936 A * | 12/1994 | Kerth et al. | 341/150 |
| 6,124,814 A * | 9/2000 | Lee et al. | 341/143 |
| 6,147,522 A * | 11/2000 | Rhode et al. | 327/93 |
| 6,731,155 B1 * | 5/2004 | Hakkarainen et al. | 327/390 |

OTHER PUBLICATIONS

"Circuit Techniques for Reducing the Effects of Op-Amp Imperfections: AUtozeroing, Correlated Double Sampling, and Chopper Stabilization" by Christian C. Enz & Gabor C. Temes, Proceedings of the IEEE, Nov. 1996.

* cited by examiner

*Primary Examiner*—My-Trang Nu Ton
(74) *Attorney, Agent, or Firm*—Thompson & Knight LLP; James J. Murphy

(57) ABSTRACT

A sample and hold circuit including a sampling capacitor for storing a sample of an input signal, an output stage for outputting the sample stored on the sampling capacitor; and input circuitry for sampling the input signal and storing the sample on the sampling capacitor. The input circuitry includes an autozeroing input buffer which selectively samples the input signal during a first operating phase and holds a sample of the input signal during a second operating phase. The autozeroing input buffer cancels any offset error. The input circuitry also includes switching circuitry for selectively coupling the sampling capacitor with an input of the sample and hold circuitry during the second operating phase and to an output of the autozeroing input buffer during the first operating phase.

25 Claims, 5 Drawing Sheets

SAMPLE AND HOLD CIRCUITS AND METHODS WITH OFFSET ERROR CORRECTION AND SYSTEMS USING THE SAME

FIELD OF INVENTION

The present invention relates in general to mixed signal processing and in particular to sample and hold circuits and methods with offset error correction and systems using the same.

BACKGROUND OF INVENTION

Data acquisition systems, such as analog to digital converters (ADCs), normally include a front-end sample and hold stage for capturing an input signal. Typically, this sample and hold stage is implemented with a switched-capacitor circuit in which a sampling capacitor is switched between sampling and integrating modes. Generally, during the sampling mode, the input signal is sampled onto the sampling capacitor and during the integration phase, the charge on the sampling capacitor is transferred to an integrating capacitor.

In order to maintain a high dynamic range, the sampling capacitor in switched-capacitor circuits, such as sample and hold stages, must be large to minimize $$\frac{KT}{C}$$

noise. Therefore, high dynamic range sample and hold circuits require that the input signal source be capable of delivering a relatively large current for rapidly charging the large sampling capacitor. In high sampling rate applications, such as delta sigma ADCs, this current requirement becomes even more severe due to the relatively small amount of time available during each sampling event to charge the sampling capacitor. Furthermore, the sampling current is often non-linear due to charge injection and nonlinear input impedances caused by the switching circuitry controlling the charging of the sampling capacitor, which in turn mandates severe linearity requirements on the input signal source. Finally, the sampling current must settle quickly to avoid distortion as a sequence of samples of the input signal are taken.

In sum, new techniques are required for use in high dynamic range data acquisition systems. These techniques should address the problems related to the use of large sampling capacitors, especially at high sampling rates.

SUMMARY OF INVENTION

The principles of the present invention are embodied in sample and hold circuits utilizing input buffers which include automatic offset compensation capability. According to one particular embodiment of these principles, a sample and hold circuit is disclosed which includes a sampling capacitor for storing a sample of an input signal, an output stage for outputting the sample stored on the sampling capacitor, and input circuitry for sampling the input signal and storing the sample on the sampling capacitor. The input circuitry includes an autozeroing input buffer which selectively samples the input signal during a first operating phase and holds a sample of the input signal during a second operating phase. The autozeroing input buffer cancels any offset error. The input circuitry also includes switching circuitry for selectively coupling the sampling capacitor with an input of the sample and hold circuitry during the first operating phase and to an output of the autozeroing input buffer during the second operating phase.

The principles of the present invention realize substantial advantages over the prior art, particularly when embodied in a sample and hold stages and similar circuits operating at relatively high oversampling rates. These principles allow for a substantial reduction of the loading on the input signal source by increasing the input impedance of the embodying circuit or system. Additionally, linearity of the circuit system is improved as a result of a substantial reduction in non-linear charge drawn from a signal source.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–5 of the drawings, in which like numbers designate like parts.

Figure 1:
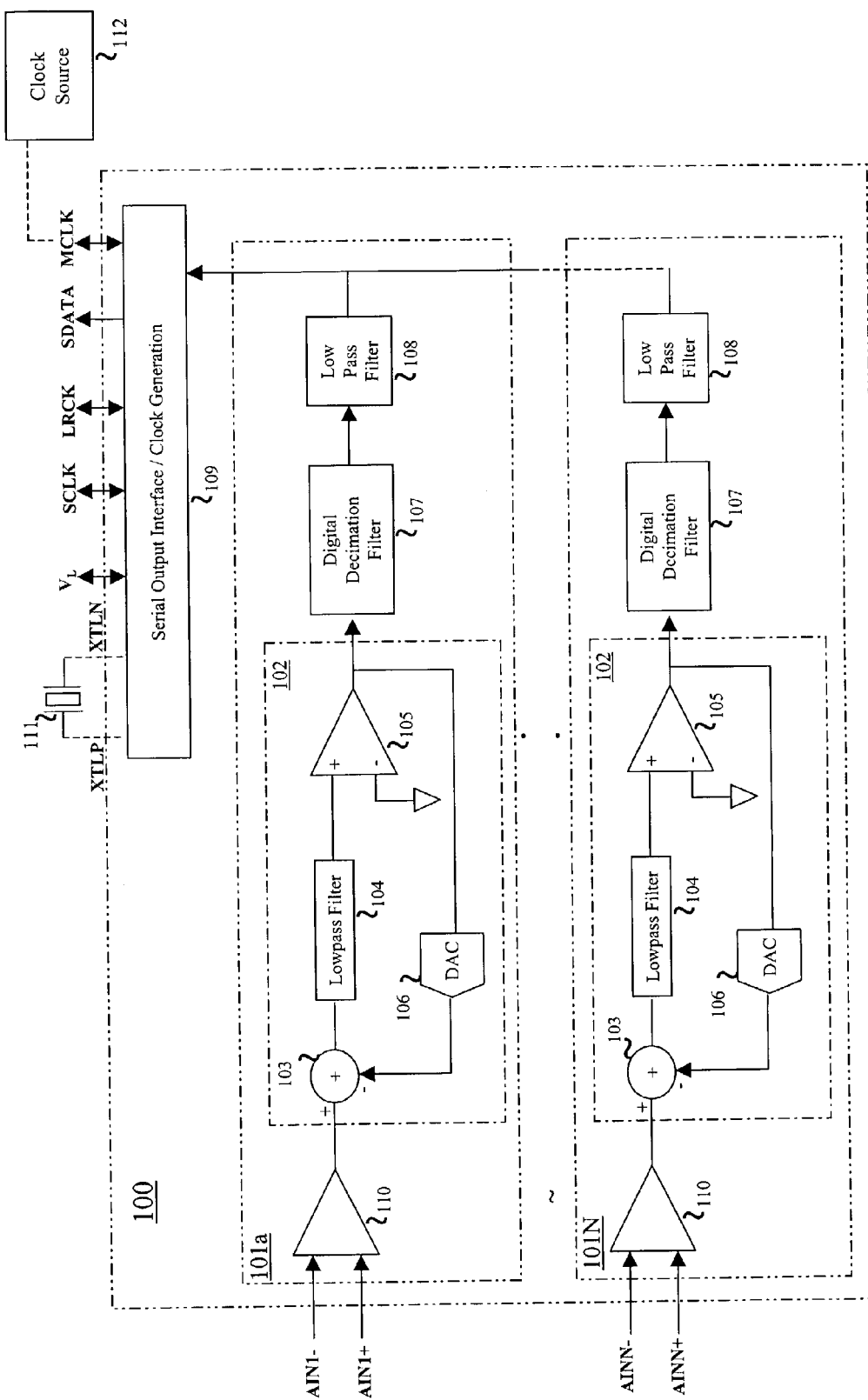
FIG. 1 is a block diagram of an exemplary analog to digital converter (ADC) system suitable for describing the practice of the principles of the present invention.

FIG. 1 is a high-level block diagram of a single-chip audio analog-to-digital converter (ADC) 100 suitable for practicing the principles of the present invention. For illustrative purposes, ADC 100 is a delta-sigma ADC, although the present inventive principles are applicable to other types of ADCs, as well as digital-to-analog converter (DACs) and Codecs.

ADC 100 includes N conversion paths 101a, b, . . . N, of which two paths 101a and 101N are shown for reference, for converting N channels of differential analog audio data respectively received at analog differential inputs AINN+/−, where N is an integer of one (1) or greater. The analog inputs AINN+/− for each channel are passed through an input sample and hold 110 and then a delta-sigma modulator 102 which performs noise shaping on the sampled input stream.

Each delta-sigma modulator 102 is represented in FIG. 1 by a summer 103, low-pass filter 104, comparator (quantizer) 105, and DAC 106 in the delta-sigma feedback loop. The outputs from delta-sigma modulators 102 are each passed through a digital decimation filter 107, which reduces the sample rate, and also a low pass filter 108. Delta sigma modulators 102 sample the corresponding analog input signals at an oversampling rate and output digital data in either single-bit or multiple-bit form, depending on the quantization, at the oversampling rate. The resulting quantization noise is shaped and generally shifted to frequencies above the audio band.

The resulting digital audio data are output through a single serial data port SDATA of serial output interface/ clock generation circuitry 109, timed with a serial clock (SCLK) signal and a left-right clock (sample) signal (LR-CLK). In the slave mode, the SCLK and LRCLK signals are generated externally and input to ADC 100 along with the master clock (MCLK) signal generated by an external clock source 112. In the master mode, the master clock (MCLK) signal is generated from an external crystal 111 and thereafter utilized on-chip to generate the SCLK and LRCK signals, which are then output along with the corresponding serial data.

Figure 2:
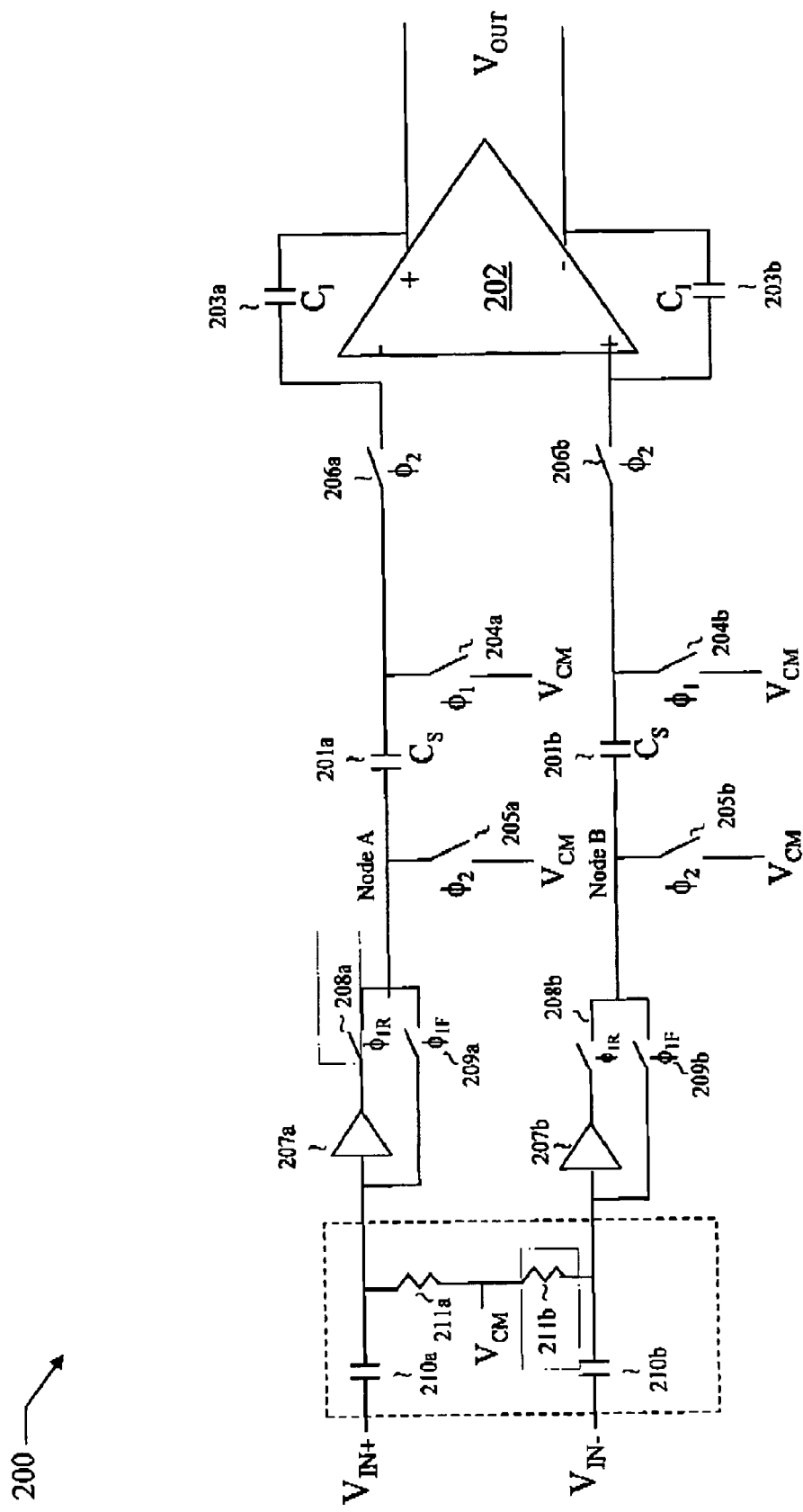
FIG. 2 is an electrical schematic diagram of a conventional differential sample and hold circuit.

FIG. 2 is an electrical schematic diagram of a conventional differential sample and hold circuit 200 including a pair of sampling capacitors ($C_s$) 101a and 101b, and an operational amplifier integrator stage including an operational amplifier 202 and integration capacitors ($C_i$) 203a and 203b. Sample and hold circuit 200 operates in two phases, labeled $\phi_1$ and $\phi_2$, with a phase $\phi_1$ having fine and rough sub-phases, respectively labeled $\phi_{1R}$ and $\phi_{1F}$.

During sampling phase $\phi_1$, switches 204a and 204b, each couple a corresponding plate of sampling capacitors 201a and 201b to a common mode voltage $V_{cm}$. Then during rough sampling sub-phase $\phi_{1R}$, the input voltage across inputs $V_{in+}$ and $V_{in-}$ is sampled onto node A and node B through input buffers 207a and 207b through switches 208a and 208b. During the subsequent fine sampling sub-phase $\phi_{1F}$, switches 208a and 208b open and the charging of node A and node B is completed directly from the inputs $V_{in+}$ and $V_{in-}$ through switches 209a and 209b.

During the integration phase $\phi_2$, switches 204a and 204b open and switches 205a–205b and 206–206b close. Consequently, the charges on nodes A and B are transferred to integrator capacitors 203a and 203b at the inverting (−) and non-inverting (+) inputs to operational amplifier 202.

In the conventional circuit of FIG. 2, input buffers 207a and 207b, which charge sampling capacitors 201a and 201b during rough sampling sub-phase $\phi_{1R}$ are typically continuous time buffers having a unity gain configuration for improving the linearity of the charging operation. When buffers 207a–207b are continuous time buffers, buffers 207a–207b normally include input pairs of back-to-back P-channel and N-channel transistors to accommodate relatively large swings in the input voltage $V_{in}$. These input transistor pairs introduce a signal-dependent offset component which in turn can cause distortion during the sampling operation.

Conventional sample and hold circuit 100 shown in FIG. 1 also includes a pair of AC-coupling capacitors at 210a–210b in series with the source of the input signal $V_{in}$. Generally, AC-coupling capacitors 210–210b act as high-pass filters which attenuate very low frequency components in the input signal and the DC offset in the input voltage $V_{in}$. However, AC-coupling capacitors 210a–210b charge-share any air charge introduced by buffers 207a–207b during $\phi_{1R}$ sub-phase. The result is a summation of both common mode and differential error charge on AC-coupling capacitors 210a–210b. In turn, error charge summation on AC-coupling capacitors 201–210b causes severe linearity and dynamic range limitations on sample and hold circuit 100.

In order to alleviate problems with error charge summation on AC-coupling capacitors 210–210b, in exemplary the configuration of FIG. 2 conventional sampler and hold circuit 200 includes a pair of shunt resistors 211a–211b. Generally, shunt resistors 211a–211b are sized inversely proportional to the expected magnitude of the error introduced by buffers 207–207b in each sampling cycle to draw current from the input nodes and thereby prevent error summation. However, shunt resistors 211a–211b reduce the input impedance of sample and hold circuit 200 and further load the input signal source.

Figure 3:
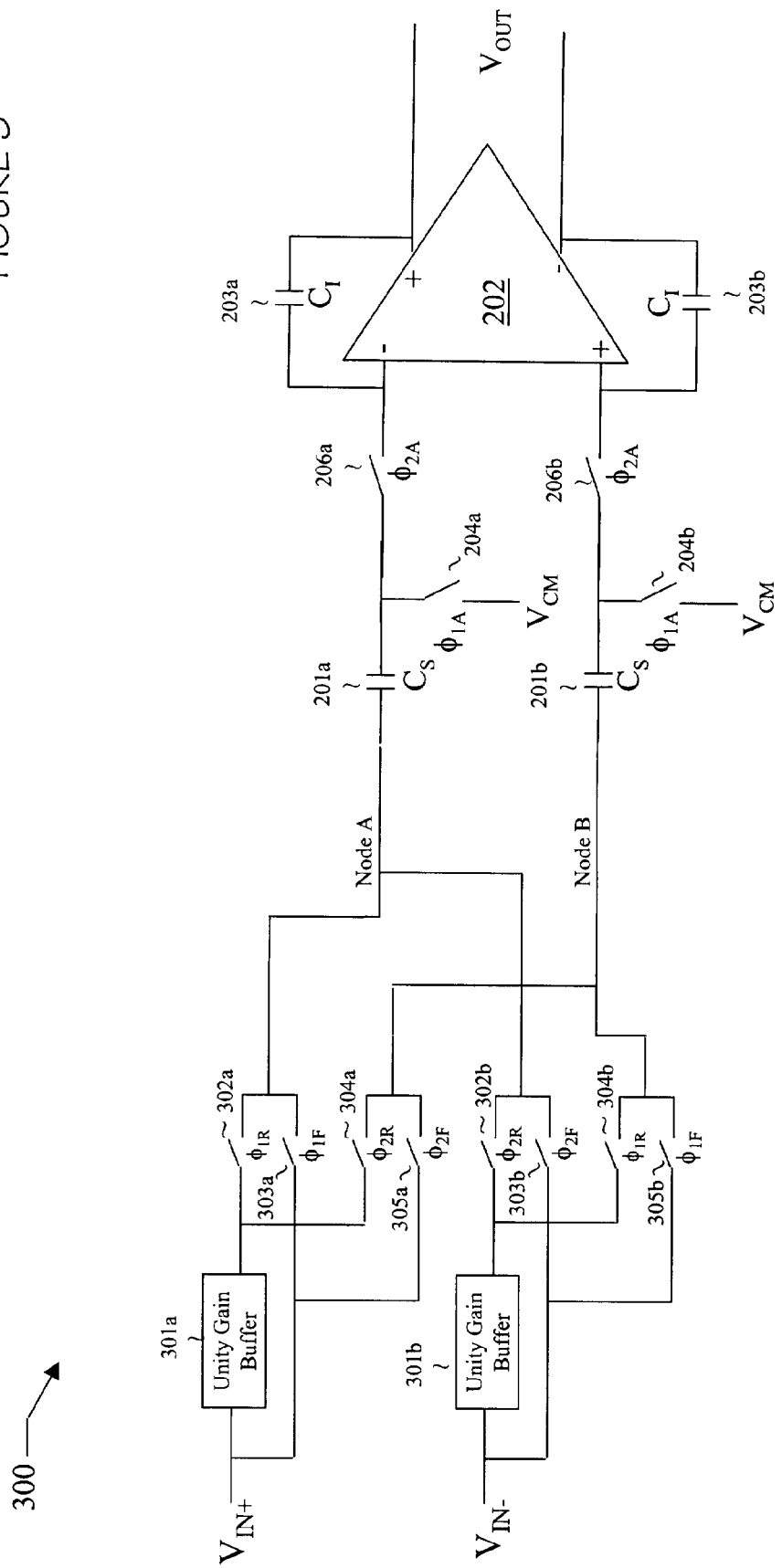
FIG. 3 is an electrical schematic diagram of an exemplary sample and hold circuit embodying the principles of the present invention.

FIG. 3 is an electrical schematic diagram of a representative sample and hold circuit 300 according to one embodiment of the principles of the present invention. Sample and hold circuit 300 is suitable in applications such as sample and hold stages 101a–101b of ADC 100 shown in FIG. 1.

Sample and hold circuit 300 includes a pair of auto-zeroing unity gain buffers 301a–301b associated with the corresponding inputs $V_{in+}$ and $V_{in-}$. Auto-zeroing unity gain buffers 301a–301b will be discussed in further detail below in conjunction with FIG. 4. Generally, however, during the rough sampling sub-phase $\phi_{1R}$, unity gain buffer 301a drives node A at sampling capacitor 201a from input $V_{in+}$ while unity gain buffer 301b drives node B at sampling capacitor 201b from the input $V_{in-}$. Using a double sampling scheme, during rough sub-phase $\phi_{2R}$ of integration phase $\phi_2$, unity gain buffer 301a drives node B and unit gain buffer 301b drives node A to force the charge from sampling capacitors 201b and 201a to integration capacitors 203b and 203a. During fine sub-phases $\phi_{1F}$ and $\phi_{2F}$ of both sampling phase $\phi_1$ and integration phase $\phi_2$, unity gain buffers 301a–301b bypassed and node A and node B are driven directly from the inputs $A_{in+}$ and $A_{in-}$. The selective coupling of nodes A and B to the outputs of unity gain buffers 301a–301b or directly to the inputs $A_{IN+}$ and $A_{IN-}$ is controlled by a set of switches 302a–302b, 303a–303b, 304a–304b and 305–305b of FIG. 3. The preferred operation of these switches, and sample and hold circuit 300 as a whole, will be discussed further in conjunction with the timing diagram of FIG. 5.

Figure 4:
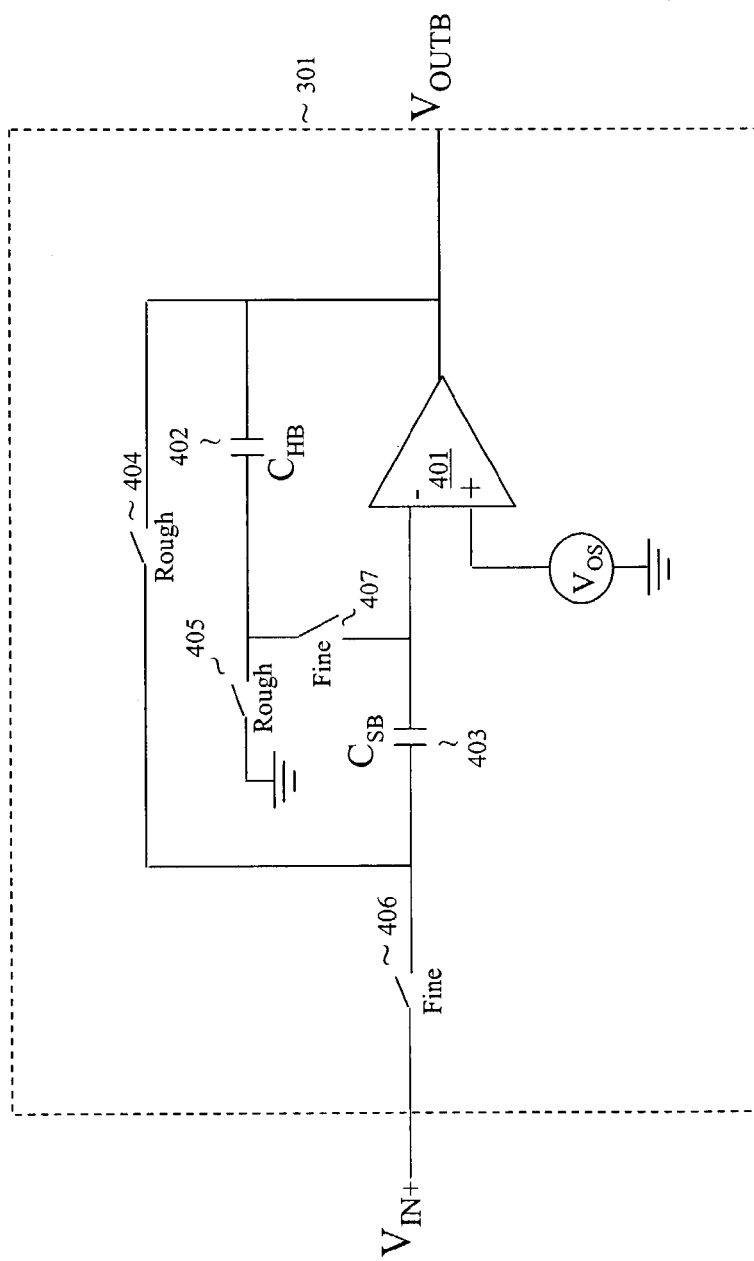
FIG. 4 is a more detailed electrical schematic diagram of a representative unity gain input buffer embodying the inventive principles and suitable for utilization as the unit gain input buffers shown in FIG. 3.

FIG. 4 is a more detailed electrical schematic diagram of a selected one of the auto-zeroing unit gain buffers 301 shown in FIG. 3. Buffers 301 operate in response to two control signals labeled ROUGH and FINE. The control signal ROUGH is active during both rough sampling sub-phase $\phi_{1R}$ and rough integration sub-phase $\phi_{2R}$. The control signal FINE is active during both fine sampling sub-phase $\phi_{1F}$ and integration fine sub-phase $\phi_{2F}$.

One advantage of the embodiment of unit gain buffers 301a–301b shown in FIG. 4 is its capability of self-canceling the voltage offset $V_{OS}$ generated by amplifier 401. Other auto-zeroing buffers could be used in alternate embodiments.

Auto-zeroing buffer 301 includes a buffer hold capacitor ($C_{HB}$) 402 and a buffer sampling capacitor ($C_{SB}$) and a set of controlling switches 404–407 responsive to the control signals FINE and ROUGH.

During the buffer sample phase, the ROUGH signal is inactive and the FINE signal is active. Consequently switches 404 and 405 open and switches 406 and 407 close. In this configuration, sampling capacitor 403 charges to approximately $V_{CSB}=V_{IN}-V_{OS}$, relative to the common mode voltage coupled to the non-inverting (+) amplifier input. Hold capacitor 402 charges to approximately $V_{CHB}=V_{OS}-)V_{IN}$, in which $V_{IN}$ is the change in $V_{IN}$ from the last sample to the current sample. The buffer output voltage $V_{OUTB}$ is disregarded during this phase.

During the buffer hold phase, the ROUGH signal is active and the FINE signal is inactive. In this state, switches 404 and 405 are closed and switches 406 and 407 are open. As a result, the buffer output voltage $V_{OUTB}$ is pulled by sampling capacitor 403, relative to the common mode voltage, to $V_{OUTB}=V_{IN}-V_{OS}+V_{OS}$, such that the offset voltage $V_{os}$ is cancelled at the output of buffer 301 relative to the common mode voltage.

The embodiment of unity gain buffers 301 shown in FIG. 4 realizes substantial advantages. The auto-zero error cancellation function acts to cancel both static and signal dependent offset. Any residual error component is only due to charge injection of switches 407 (FIG. 4) and 302a–302b (FIG. 3), and consequently is minimized by minimizing switch sizes. Furthermore, sampling capacitor 403 only samples changes in the input signal $V_{IN}$ from sample to sample. This is particularly advantageous in over-sampled systems operating at high sampling rates since the charge provided by the signal source is substantially reduced along with the signal source loading.

Figure 5:
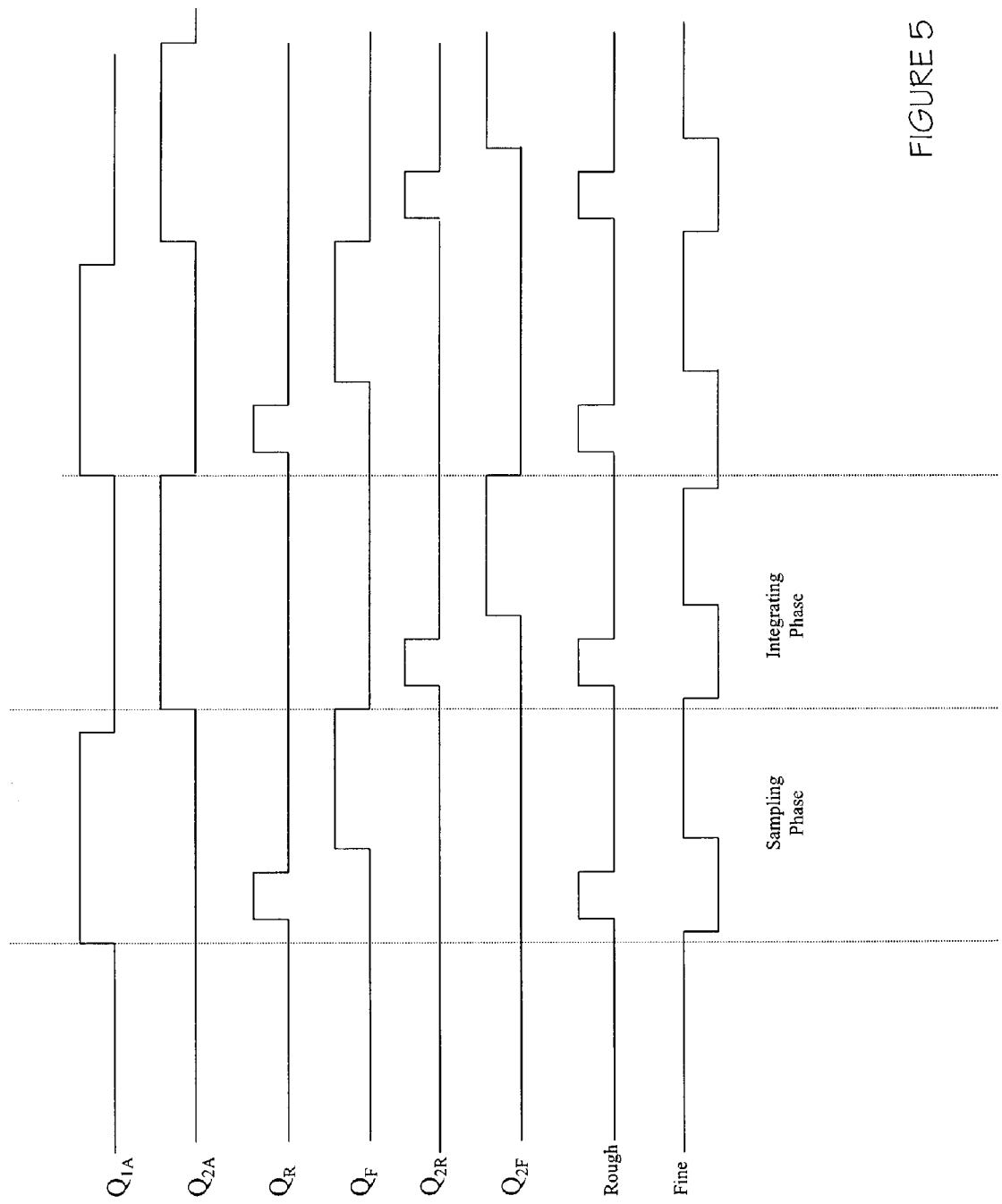
FIG. 5 is a timing diagram illustrating an exemplary operating sequence of the sample and hold circuit shown in FIGS. 3 and 4.

The overall operation of sample and hold circuit 300 of FIG. 3 is now described in further detail in conjunction with the timing diagram of FIG. 5.

At the start of the sampling phase, the $\phi_{1A}$ control signal is active and the $\phi_{2A}$ signal inactive, such that switches 204a–204b close and 206a–206b open to allow charge transfer on to sampling capacitors 201a–201b. Next, during rough sampling phase $\phi_{1R}$, switches 302a and 302b close to couple the outputs of unity gain buffers 301a–301b to node A and node B, respectively. Switches 303a–303b, 304a–304b and 305a–305b open. During the rough sampling phase $\phi_{1R}$, the signal ROUGH is active and the signal FINE inactive such that unity gain buffers 301a and 301b are in the hold state. Unity gain buffers 301a–301b consequently roughly charge sampling capacitors 201a–201b.

During sampling fine sub-phase $\phi_{1F}$, switches 302a–302b open and switches 303a–303b close and the charging of sampling capacitors 201a–201b is completed directly from the signal inputs $V_{IN+}$ and $V_{IN-}$. After a small delay, the ROUGH control signal transitions to an inactive state and FINE transitions to active state. Sampling capacitors 403 of each unity gain buffer 301a and 301b are then updated as described above. The outputs from unity gain buffers 301a–301b are discarded during the fine sampling sub-phase. At the end of the fine sampling sub-phase $\phi_{1F}$, switches 303a and 303b open.

During the integration phase, control signals $\phi_{1A}$ and $\phi_{2A}$ open switches 204a–204b and close switches 206a–206b to enable the charge to transfer from sampling capacitors 201a–201b to integrated capacitors 203a and 203b. Switches 304a and 304b close in response to control signal $\phi_{2R}$ to cross-couple the output of unity gain buffer 301a to node B and unity gain buffer 301b to node A to implement double sampling. After a small delay, the ROUGH control signal transitions to an active state and the FINE control signal transitions to an inactive state such that unity gain buffers 301a–301b enter the hold state for driving node B and node A respectively.

During the fine integration phase, switches 304a–304b re-open to disconnect unity gain buffers 301a–301b from nodes B and A. The control signal $\phi_{2F}$ closes switches 305a and 305b to cross-couple the input $V_{IN+}$ with node B and input $V_{IN-}$ to node A. The integration phase is then completed by driving sampling capacitors 201a–201b directly from the input $V_{IN-}$ and $V_{IN+}$. Concurrently, the FINE signal transitions to active state and the ROUGH signal to an active state. Unity gain buffers 301a–301b therefore update the charge on corresponding buffer sampling capacitors 403.

The process illustrated in FIG. 5, which utilizes both fine and rough sub-phases in each of the sampling and integration phases, repeats itself to continuously sample the input signal $V_{IN}$. Advantageously, both the static and signal dependent offsets in unity gain buffers 301a–301b are removed with the auto-zeroing technique described above. As previously indicated, charge injection errors are minimized by utilizing small switches to implement each unity gain buffer 301a–301b. Therefore, in the ac-coupled mode, the errors introduced by unity gain buffers 301a–301b are minimized. Distortion related to error summation is also substantially reduced. Any residual error can be prevented using relatively large shunt resistors which minimize the loading on the input signal source.

In sum, the principles of the present invention realize substantial advantages, particularly when embodied in a sample and hold stages and similar circuits operating at relatively high oversampling rates. These principles allow for a substantial reduction of the loading on the input signal source by increasing the input impedance of the embodying circuit or system. Additionally, linearity of the system is improved as a result of a substantial reduction in non-linear charge drawn from a signal source. Actual implementation of the inventive principles requires a minimal number of external components and is completely transparent to the end user.

While a particular embodiment of the invention has been shown and described, changes and modifications may be made therein without departing from the invention in its broader aspects, and, therefore, the aim in the appended claims is to cover all such changes and modifications as fall within the true spirit and scope of the invention.

What is claimed is:

1. A sampling circuit comprising:
    a sampling capacitor for storing a sample of an input signal presented at an input;
    a dynamic buffer operating in a buffer sampling phase and a buffer hold phase for charging the sampling capacitor during a sampling circuit rough phase; and
    switching-circuitry for charging the sampling capacitor from the input during a sampling circuit fine phase.

2. The sampling circuit of claim 1, wherein the dynamic buffer samples the input signal during a selected fine phase and transfers the sample to the capacitor during a subsequent rough phase.

3. The sampling circuit of claim 1, wherein the dynamic buffer comprises an autozeroing buffer operable to cancel any buffer offset error.

4. The sampling circuit of claim 1, wherein the fine phase comprises a fine sampling phase and the rough phase comprises a rough sampling phase.

5. The sampling circuit of claim 1, wherein the fine phase comprises a fine integration phase and the rough operating phase comprises a rough integration phase.

6. The sampling circuit of claim 1, wherein the dynamic buffer comprises: an operational amplifier having an input offset voltage;
    a buffer sampling capacitor for storing the sample of the input signal;
    a buffer hold capacitor for holding an output voltage of the operational amplifier;
    switching circuitry operable to:
        during a selected fine phase, sample onto the sampling capacitor a buffer sampling voltage of an input voltage less the offset voltage; and during a corresponding rough phase, couple the buffer sampling capacitor and the hold capacitor to a buffer output to cancel the offset voltage from the buffer sampling voltage.

7. The sampling circuit of claim 1, further comprising:
an output stage; and
switching circuitry for transferring charge from the capacitor to the output stage during a sampling circuit dump and integration phase subsequent to the sampling circuit fine phase.

8. A method of sampling a signal comprising:
charging a sampling capacitor with a dynamic buffer during a rough operating phase, the dynamic buffer operating in a buffer sampling phase and a buffer hold phase; and
charging the sampling capacitor from an input receiving a signal during a fine operating phase.

9. The method of claim 8, wherein charging the capacitor with the dynamic buffer comprises:
selectively sampling a sample of the signal at the input during a selected fine operating phase; and
transferring the sample to the capacitor during subsequent a corresponding rough operating phase.

10. The method of claim 8, wherein the fine operating phase comprises a fine sampling phase and the rough operating phase comprises a rough sampling phase.

11. The method of claim 8, wherein the fine operating phase comprises a fine integration phase and the rough operating phase comprises a rough integration phase.

12. The method of claim 8, wherein charging the sampling capacitor with the dynamic buffer comprises sampling the signal during a selected fine operating phase with an autozeroing input buffer including a buffer sampling capacitor for holding a buffer sampling voltage of an input voltage less an offset voltage of the input buffer.

13. The method of claim 12, further comprising holding the sample in the input buffer during a subsequent rough operating phase and canceling an offset error, and including coupling the buffer sampling capacitor to a buffer output and a hold capacitor to cancel the offset error from the buffer sampling voltage.

14. The method of claim 8 further comprising transferring charge from the sampling capacitor to an output stage during a dump phase subsequent to the fire operating phase.

15. A data converter comprising:
a sampling capacitor for storing a sample of an input signal received at an input;
an operational amplifier for outputting the sample stored on the sampling capacitor;
a dynamic input buffer, operating in buffer sample and buffer hold phases, for selectively receiving the input signal during a fine operating phase and driving the input signal during a rough operating phase, the input buffer canceling any operational amplifier offset error;
switching circuitry for selectively coupling the sampling capacitor with the input during a fine operating phase; and
switching circuitry for selectively transferring charge from the sampling capacitor to the operational amplifier input during a dump and integration phase subsequent to the fine operating phase.

16. The data converter of claim 15, wherein the rough operating phase comprises a rough sampling phase and the fine operating phase comprises a fine sampling phase.

17. The data converter of claim 15, wherein the rough operating phase comprises a rough integration phase and the fine operating phase comprises a fine integration phase.

18. The data converter of claim 15, wherein the input signal is an analog input signal.

19. The data converter of claim 15, wherein the data converter comprises an audio analog to digital converter.

20. The data converter of claim 15, wherein the dynamic input buffer comprises a selected one of a set of input buffers sampling a differential input signal.

21. An audio data converter comprising:
a sampling circuit including a sampling capacitor for storing a sample of an audio input signal;
a dynamic buffer operating in buffer sample and buffer hold phases for charging the sampling capacitor during a rough operating phase; and
switching circuitry charging the sampling capacitor from an input of the sampling circuit during a fine operating phase.

22. The audio data converter of claim 21, wherein the dynamic buffer samples the input of the sampling circuitry during a selected fine operating phase and transfers the sample to the sampling capacitor during a subsequent rough operating phase.

23. The audio data converter of claim 21, wherein the sampling circuit forms a portion of an audio analog to digital converter.

24. The audio data converter of claim 21, wherein the fine operating phase comprises a fine sampling phase and the rough operating phase comprises a rough sampling phase.

25. The audio data converter of claim 21, wherein the fine operating phase comprises a fine integration phase and the rough operating phase comprises a rough integration phase.

* * * * *